US012641912B2

(12) United States Patent
Tatsumi et al.

(10) Patent No.: US 12,641,912 B2
(45) Date of Patent: May 26, 2026

(54) LIGHT SENSITIVE ELEMENT

(71) Applicant: NTT, Inc., Tokyo (JP)

(72) Inventors: Shoko Tatsumi, Musashino (JP);
Yasuhiko Nakanishi, Musashino (JP);
Masahiro Nada, Musashino (JP)

(73) Assignee: NTT, Inc., Tokyo (JP)

( * ) Notice: Subject to any disclaimer, the term of this
patent is extended or adjusted under 35
U.S.C. 154(b) by 386 days.

(21) Appl. No.: 18/553,065

(22) PCT Filed: Apr. 9, 2021

(86) PCT No.: PCT/JP2021/015102
§ 371 (c)(1),
(2) Date: Sep. 28, 2023

(87) PCT Pub. No.: WO2022/215275
PCT Pub. Date: Oct. 13, 2022

(65) Prior Publication Data
US 2024/0186434 A1 Jun. 6, 2024

(51) Int. Cl.
H10F 77/14 (2025.01)
H10F 77/30 (2025.01)
H10F 77/42 (2025.01)
(52) U.S. Cl.
CPC ......... H10F 77/147 (2025.01); H10F 77/306
(2025.01); H10F 77/488 (2025.01)
(58) Field of Classification Search
CPC .... H10F 77/147; H10F 77/306; H10F 77/488;
H10F 30/20; H10F 77/40; H10F 77/413
See application file for complete search history.

(56) References Cited

U.S. PATENT DOCUMENTS

| | | | | |
|---|---|---|---|---|
| 4,894,526 A | * | 1/1990 | Bethea | H10F 30/21 |
| | | | | 257/15 |
| 5,023,685 A | * | 6/1991 | Bethea | B82Y 20/00 |
| | | | | 257/E27.152 |
| 5,661,590 A | * | 8/1997 | Almogy | H10F 77/147 |
| | | | | 257/E31.038 |

(Continued)

FOREIGN PATENT DOCUMENTS

| | | |
|---|---|---|
| CN | 102914834 | 2/2013 |
| JP | 2000-36615 A | 2/2000 |

(Continued)

*Primary Examiner* — Victor A Mandala
(74) *Attorney, Agent, or Firm* — Workman Nydegger

(57) ABSTRACT

In a light receiving element, a first semiconductor layer that
is formed on the upper surface of a substrate and is formed
with a semiconductor of a first conductivity type, a light
absorbing layer formed with a semiconductor, a second
semiconductor layer formed with a semiconductor of a
second conductivity type, a first electrode that is formed in
contact with the second semiconductor layer, is formed with
a metal, and functions as a reflective film, and a second
electrode formed on the first semiconductor layer are formed
in a vertical direction on the upper surface of the substrate.
In the light receiving element, a slope that is neither per-
pendicular nor parallel to the substrate plane is formed on
the substrate, and incident light that has perpendicularly
entered the slope is made to enter the light absorbing layer
obliquely with respect to the vertical direction.

11 Claims, 8 Drawing Sheets

(56)     References Cited

U.S. PATENT DOCUMENTS

| | | | | |
|---|---|---|---|---|
| 6,617,568 | B1 | 9/2003 | Matsuda | |
| 2002/0084505 | A1* | 7/2002 | Furuya | H10F 77/14 |
| | | | | 257/466 |
| 2015/0260933 | A1 | 9/2015 | Masuyama et al. | |
| 2019/0348549 | A1* | 11/2019 | Davidson | H10F 77/1248 |
| 2020/0075786 | A1* | 3/2020 | Huang | H10F 77/306 |
| 2022/0416098 | A1* | 12/2022 | Tatsumi | H10F 77/45 |
| 2023/0049438 | A1* | 2/2023 | Isomura | H10F 77/413 |
| 2023/0141520 | A1* | 5/2023 | Yamada | H10F 77/1248 |
| | | | | 257/432 |

FOREIGN PATENT DOCUMENTS

| | | | |
|---|---|---|---|
| JP | 2000-269539 | A | 9/2000 |
| JP | 2002-203982 | A | 7/2002 |
| JP | 2004-241746 | A | 8/2004 |
| JP | 2011-187607 | A | 9/2011 |
| JP | 2015-172618 | A | 10/2015 |

* cited by examiner

LIGHT SENSITIVE ELEMENT

TECHNICAL FIELD

The present invention relates to a light sensitive element, and more particularly, to a semiconductor light receiving element capable of high-speed and high-sensitivity operations.

BACKGROUND ART

As semiconductor light receiving elements that are used for optical communication, photodiodes are widely used elements. A photodiode is an element that performs photoelectric exchange by generating electrons and holes when light is absorbed through irradiation with light having an energy equal to or higher than the bandgap of a semiconductor. The most basic photodiode is called the pin photodiode, and has a structure in which an i-layer having a low impurity density is sandwiched on both sides by p-type and n-type semiconductors densely doped with impurities. When a reverse bias is applied to the pin structure, an electric field is generated in the i-layer, electrons and holes generated by light irradiation are swept, and a photocurrent is generated. The ratio of the number of carriers contributing to the photocurrent to the number of incident photons is called the external quantum efficiency, and, to increase sensitivity, it is essential to improve the external quantum efficiency.

As a means for improving the external quantum efficiency, extension of the optical path length in the light absorbing layer can be considered. There is a method of extending the optical path length by increasing the thickness of the light absorbing layer. However, as the thickness of the light absorbing layer is increased, the traveling time of the carriers becomes longer, which hinders a high-speed response. By another technique for extending the optical path length, a return structure is formed so that light passes through the light absorbing layer a plurality of times. A semiconductor light receiving element disclosed in Patent Literature 1 adopts a structure in which light enters the light absorbing layer formed on the front surface (the upper surface) of a substrate from the back surface (the lower surface) or a side surface of the substrate, and is returned by a reflective film formed on the upper surface of the light receiving element. In the light receiving element on which the reflective film is formed, light inevitably enters from the back surface of the substrate (lower surface entrance).

Also, Patent Literature 1 suggests, as a means for extending the optical path length, a method by which a cut surface that is neither perpendicular nor parallel to the substrate plane is formed on the substrate, and light enters from the cut surface. To extend the optical path length, causing light to enter obliquely with respect to the substrate plane is more advantageous than the above technique by which light is made to enter perpendicularly with respect to the substrate plane. However, incident light is made to enter without intersecting with the entrance plane of the light absorbing layer in this case. Therefore, the reflectance when incident light enters varies with each polarized wave, and the light receiving sensitivity becomes dependent on polarization. In a case where only a specific polarized wave is handled, the light receiving characteristics are constant. However, in a case where an intensity modulation direct detection method that involves various polarized waves is applied to a light receiving element, the light receiving characteristics become non-constant with respect to polarized waves, which leads to degradation of the reception characteristics. In the conventional structure, it is difficult to achieve both a decrease in polarization dependency and an extension of the optical path length.

CITATION LIST

Patent Literature

Patent Literature 1: Japanese Patent Laid-Open NO. 2011-187607

SUMMARY OF INVENTION

The present invention aims to provide a light receiving element that eliminates polarization dependency while achieving an extension of the optical path length, and has excellent reception characteristics.

In order to achieve such an objective, an embodiment of the present invention is a light receiving element in which a first semiconductor layer that is formed on the upper surface of a substrate and is formed with a semiconductor of a first conductivity type, a light absorbing layer formed with a semiconductor, a second semiconductor layer formed with a semiconductor of a second conductivity type, a first electrode that is formed in contact with the second semiconductor layer, is formed with a metal, and functions as a reflective film, and a second electrode formed on the first semiconductor layer are formed in a vertical direction on the upper surface of the substrate. In the light receiving element, a slope that is neither perpendicular nor parallel to the substrate plane is formed on the substrate, and incident light that has perpendicularly entered the slope is made to enter the light absorbing layer obliquely with respect to the vertical direction.

DESCRIPTION OF EMBODIMENTS

The following is a detailed description of embodiments of the present invention, with reference to the drawings.

First Embodiment

Figure 1:
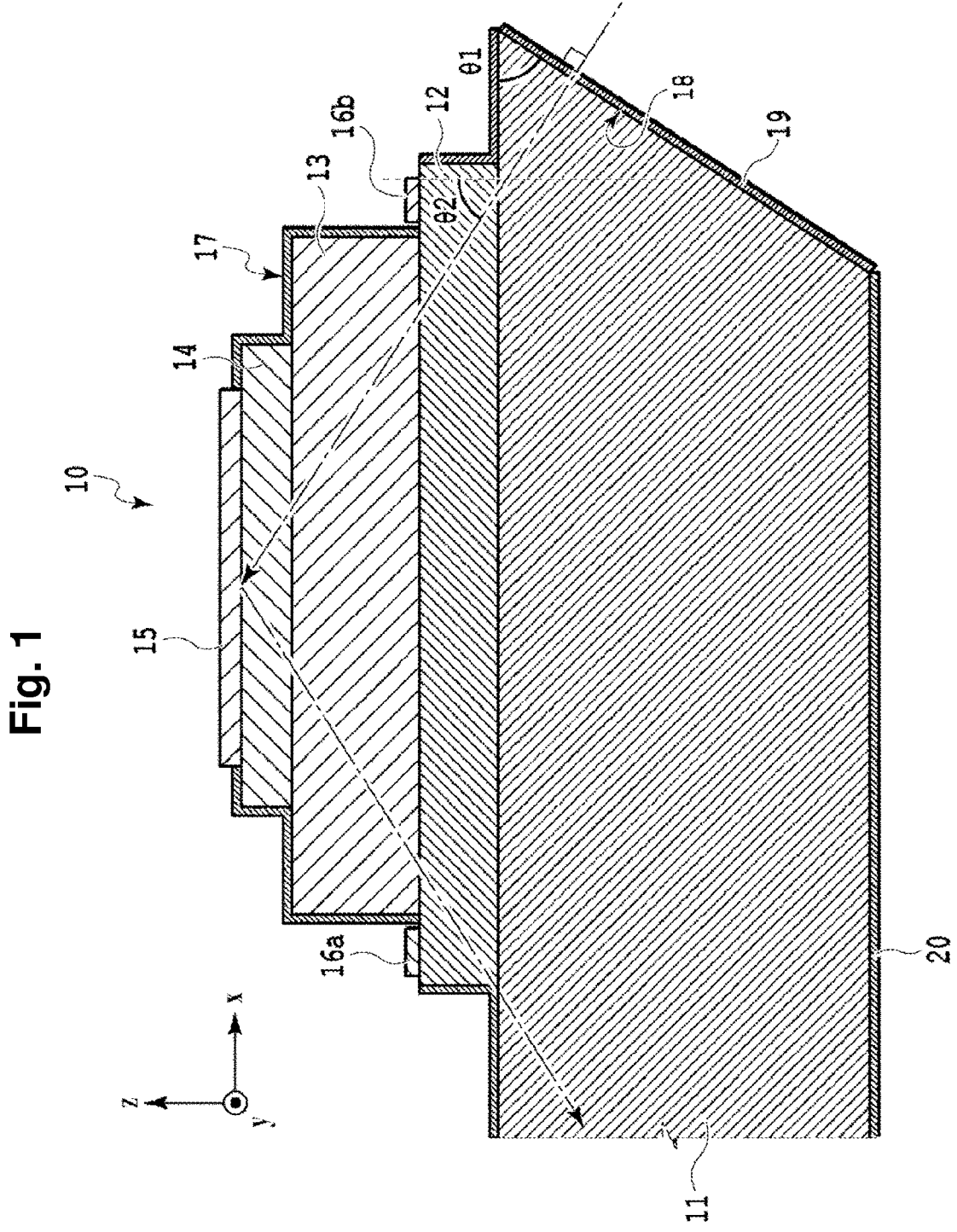
FIG. 1 is a diagram illustrating the structure of a light receiving element according to a first embodiment of the present invention.

FIG. 1 illustrates the structure of a light receiving element according to a first embodiment of the present invention. In a semiconductor light receiving element 10, a first semiconductor layer 12 that is formed on the front surface (the upper surface) of a substrate 11 and is formed with a semiconductor of a first conductivity type, a light absorbing layer 13 formed with a semiconductor, a second semiconductor layer 14 of a second conductivity type, and a first electrode 15 formed in contact with the second semiconductor layer 14 are stacked in this order. The first electrode 15 formed with a metal functions as a reflective film. Second electrodes 16a and 16b are formed on the upper surface of the first semiconductor layer 12, and the upper surface of the semiconductor light receiving element 10 excluding the electrodes is covered with a protective film 17 formed with SiN. In this manner, the mesa-shaped light receiving unit including the first semiconductor layer 12, the light absorbing layer 13, and the second semiconductor layer 14 is formed in a direction vertical to the upper surface of the substrate 11.

In the substrate 11, a slope 18 that is neither perpendicular nor parallel to the substrate plane (x-y plane) is formed, and an antireflective film 19 is formed thereon. A protective film 20 formed with SiN is also formed on the back surface (the lower surface) of the substrate 11.

According to the Fresnel equation, s-polarized waves (horizontally polarized waves) have the lowest reflectance when perpendicularly entering the plane of incidence. From the viewpoint of light receiving sensitivity, the reflectance at the incidence window is preferably low. Therefore, to achieve a light receiving element having a high light receiving sensitivity, incident light needs to enter perpendicularly with respect to the slope 18. In a case where incident light perpendicularly enters, reflectance does not have polarization dependency, unless the material of the antireflective film 19 is a birefringent material. Therefore, as incident light perpendicularly enters the slope 18 on which the antireflective film 19 that is not a birefringent material is formed, it is possible to achieve a light receiving element that has the lowest reflectance, a low loss, and a low polarization dependency.

In the first embodiment, incident light enters perpendicularly with respect to the slope 18, and enters the light absorbing layer 13 of the light receiving element 10 obliquely with respect to the z-axis, which is the semiconductor crystal growth direction, that is, the direction vertical to the upper surface of the substrate 11. The incident angle of incident light with respect to the z-axis is represented by $\theta_2$, and the acute angle of the angles formed between the substrate plane (x-y plane) and the slope 18 that is neither perpendicular nor parallel to the substrate plane is represented by $\theta_1$. In the cross-sectional view illustrated in FIG. 1, $\theta_1$ represents the angle formed between the front surface (the upper surface) of the substrate 11 and a surface that is neither perpendicular nor parallel to the substrate plane. In the first embodiment, $$\theta_1 = \theta_2, \text{ and}$$

the incident angle with respect to the light receiving element 10 is defined by the above equation.

Incident light that has entered from the slope 18, which is neither perpendicular nor parallel to the substrate plane, passes through the light absorbing layer 13, is reflected and returned by the first electrode 15 functioning as a reflective film, and again passes through the light absorbing layer 13.

The optical path length over which incident light passes through the light absorbing layer 13 is expressed as $$(\text{optical path length}) = 2x/\cos\theta_2,$$

where x represents the thickness of the light absorbing layer 13. In a case where incident light enters perpendicularly from the back surface of the substrate 11, the optical path length is twice (2x) the thickness of the light absorbing layer 13, and, in a case where $\theta_2$ is an acute angle ($0 < \cos\theta_2 < 1$), the optical path length in the light absorbing layer 13 is greater than 2x.

According to the first embodiment, as incident light enters from the slope 18, the optical path length in the light absorbing layer 13 can be made longer than that in a case where incident light enters perpendicularly with respect to the substrate plane (x-y plane). The slope 18 is a plane orthogonal to incident light, both polarized waves can enter perpendicularly with respect to the plane of incidence, and the reflectance of both polarized waves is equal. Accordingly, it is possible to achieve a light receiving element that has a lower reflectance on the plane of incidence and a lower polarization dependency, while having a greater optical path length.

Method for Manufacturing the Light Receiving Element

A means for achieving the semiconductor light receiving element 10 is now described. An n-type contact layer (the first semiconductor layer 12), the light absorbing layer 13, and a p-type contact layer (the second semiconductor layer 14) are epitaxially grown in this order on the front surface of the substrate 11 by an MOCVD method. After crystal growth, each layer is processed into a desired size by photolithography and etching to form a mesa-shaped light receiving unit. After that, the metal electrodes (15 and 16) are formed on the n-type contact layer and the p-type contact layer, respectively, by photolithography, vapor deposition, and a lift-off technique. A polyimide layer and through holes of electrode portions are then formed by coating, photolithography, and curing. A SiN film (17) is formed on the entire upper surface of the light receiving element 10, and a SiN film (20) is also formed on the entire back surface of the substrate 11. Next, the slope 18 is formed on the substrate 11 by etching, and the antireflective film 19 is formed on the slope 18.

Although a pin photodiode has been described as an example in the first embodiment, the embodiment can also be applied to an avalanche photodiode in which a multiplication layer is formed between the first semiconductor layer 12 and the second semiconductor layer 14.

The substrate material of the first embodiment is now described. Incident light passes through the inside of the substrate 11. Therefore, in the case of a material that causes light absorption in the substrate 11, the light intensity attenuates before the light reaches the light absorbing layer 13. For example, in a case where a highly carrier-doped substrate is used, attenuation of incident light due to free carrier absorption is expected. To cause the light receiving element to absorb light with high efficiency, the material of the substrate should be a semi-insulating substrate without carrier doping, such as semi-insulating InP having a substrate resistance of 1 MΩcm or higher, for example. With this arrangement, a light receiving element with a higher sensitivity can be manufactured.

(Light Output Unit)

Figure 2:
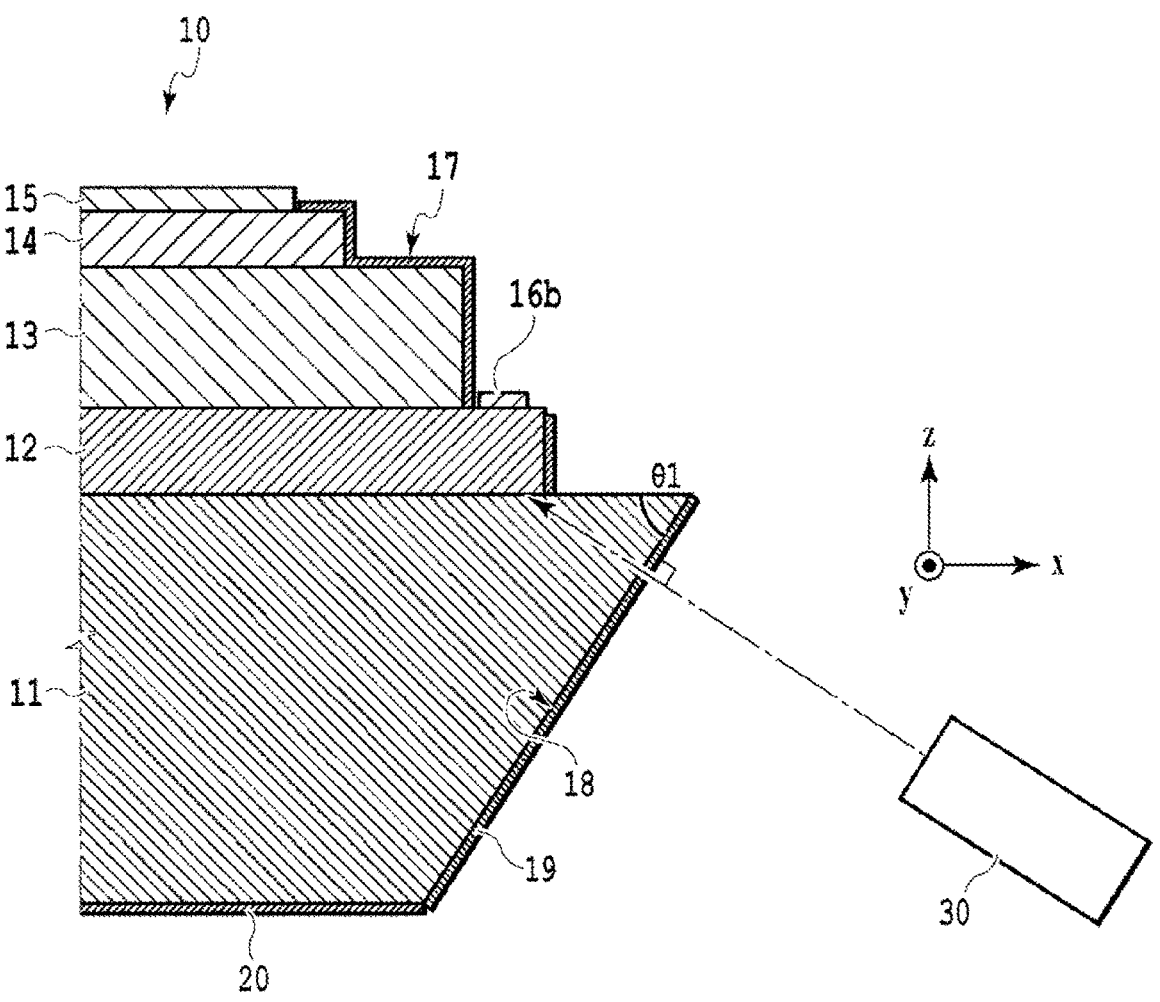
FIG. 2 is a diagram illustrating a first example of a light output unit that causes incident light to enter the light receiving element of the first embodiment.

A light output unit for causing incident light to enter the light receiving element 10 is now described. FIG. 2 illustrates a first example of a light output unit that causes incident light to enter a light receiving unit of the first embodiment. A light output unit 30 is a receptacle to which an optical fiber is connected in a light receiver, for example, and may include a lens for condensing light in some cases. The light output unit 30 in FIG. 2 represents a mode in which light directly enters perpendicularly with respect to the slope 18 of the light receiving element 10. In the first example, the number of components is small, and the polarization dependency can be easily reduced.

However, in a light receiver, the positional relationship between the light receiving element and the light output unit is limited due to the balance with the peripheral devices, and the light receiving element and the light output unit might not be positioned as desired. Therefore, if there is a mechanism capable of adjusting the positional relationship between the light output unit and the light receiving element, the range of applications of the light receiving element of the present embodiment can be expanded.

Figure 3:
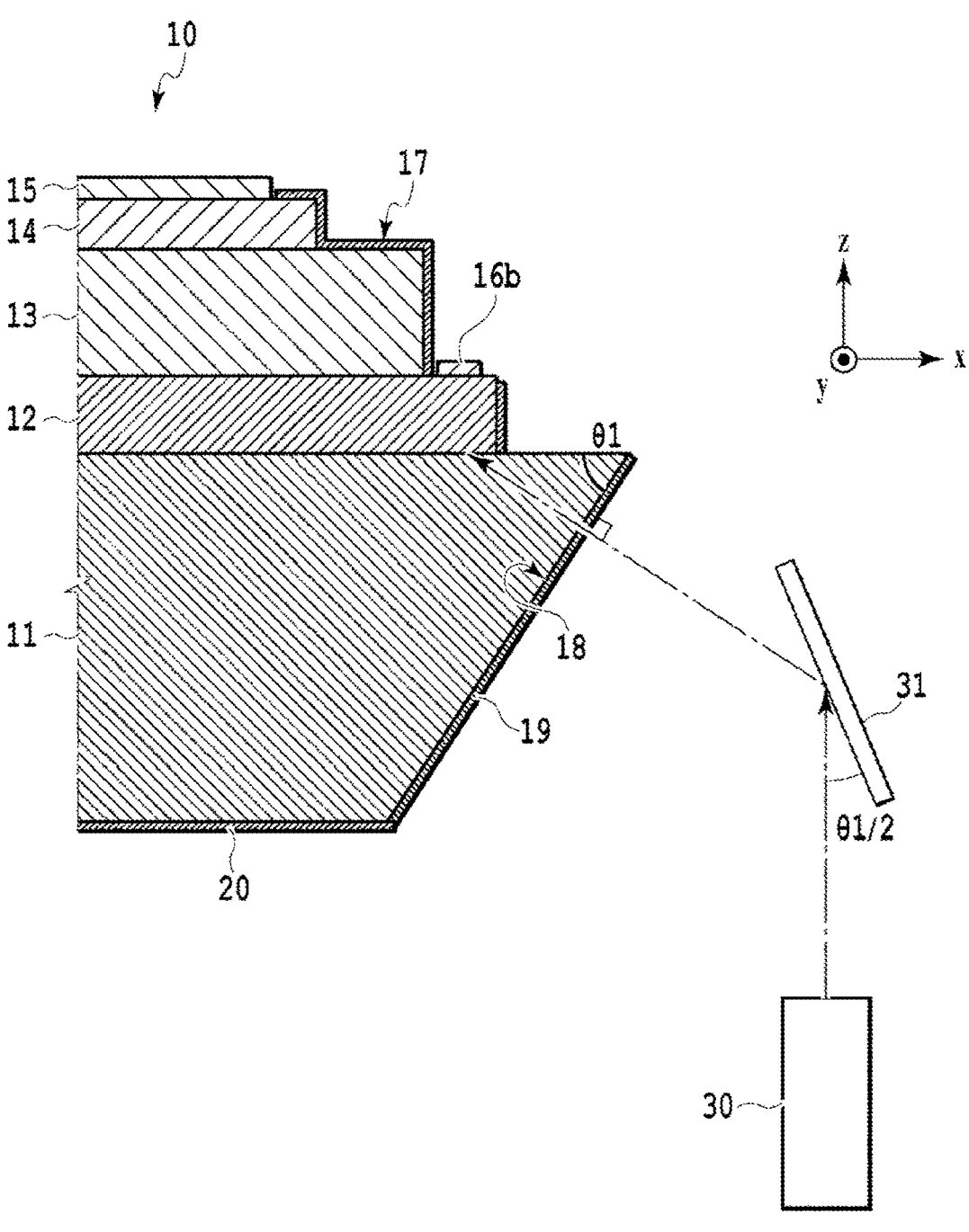
FIG. 3 is a diagram illustrating a second example of a light output unit that causes incident light to enter the light receiving element of the first embodiment.

FIG. 3 illustrates a second example of a light output unit that causes incident light to enter the light receiving element of the first embodiment. The output direction of the light output unit 30 is a direction (z-axis direction) perpendicular to the plane of the substrate 11 of the light receiving element 10. A mirror 31 is provided as a light bending unit between the surface (the slope 18) that is neither perpendicular nor parallel to the substrate plane and the light output unit 30. Of the angles formed between the substrate plane and the slope 18 that is neither perpendicular nor parallel to the substrate plane, the acute angle is represented by $\theta_1$. Here, the angle formed between the output direction (z-axis direction) from the light output unit 30 and the mirror surface of the mirror 31 is $\frac{1}{2}\theta_1$ according to the Snell's law, and incident light can be made to enter perpendicularly with respect to the slope 18.

In the present embodiment, the light output unit 30 that outputs light perpendicularly to the substrate plane has been described. However, the substrate plane and output light do not necessarily form a right angle. As the angle of the mirror is adjusted, the light output unit 30 does not need to cause light to enter perpendicularly with respect to the slope 18, and can be disposed in a light receiver so as to output light in any appropriate direction.

Figure 4:
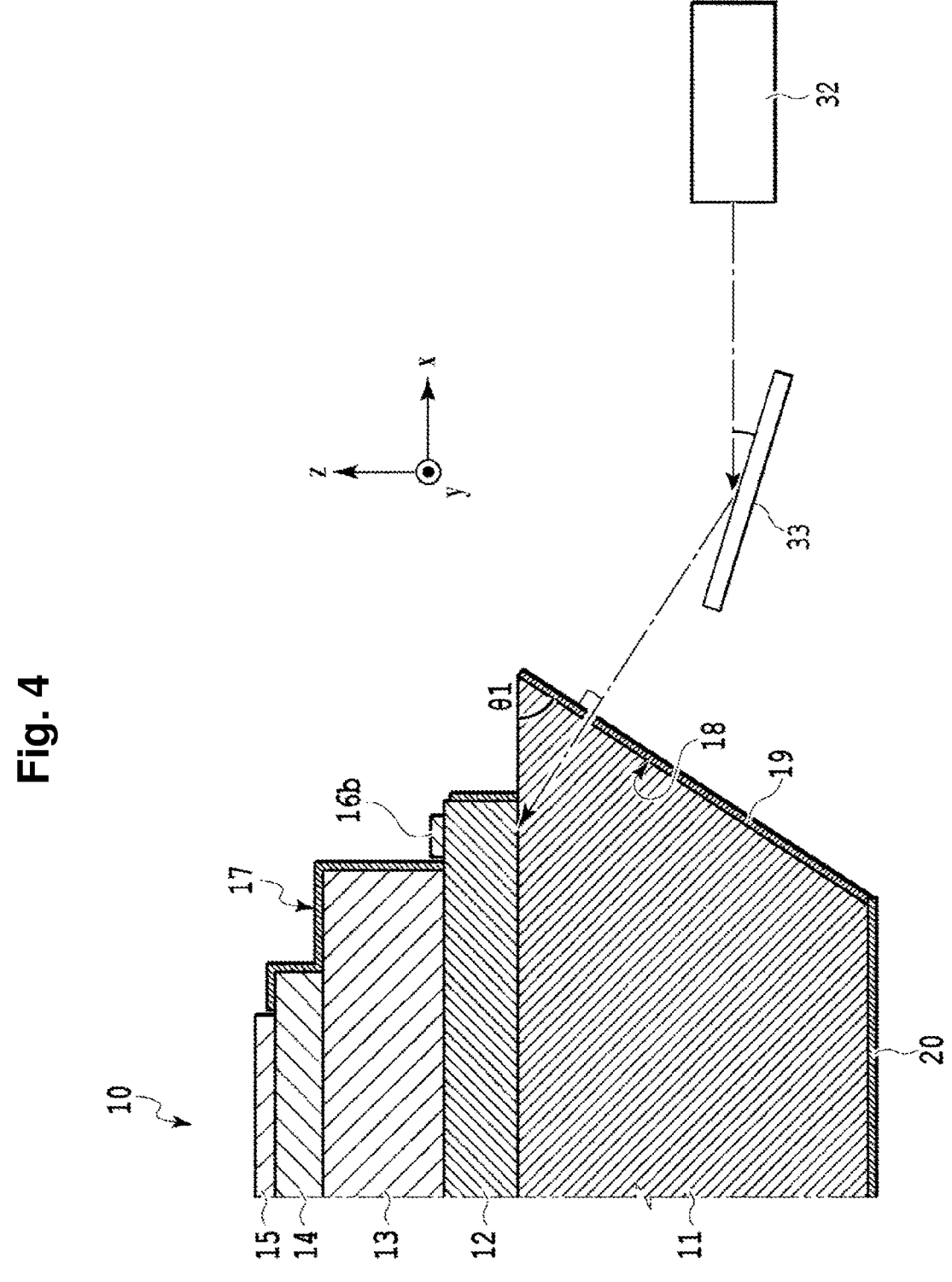
FIG. 4 is a diagram illustrating a third example of a light output unit that causes incident light to enter the light receiving element of the first embodiment.

FIG. 4 illustrates a third example of a light output unit that causes incident light to enter the light receiving element of the first embodiment. The output direction of the light output unit 32 is a direction (x-axis direction) parallel to the plane of the substrate 11 of the light receiving element 10. A mirror 33 is provided as a light bending unit between the surface (the slope 18) that is neither perpendicular nor parallel to the substrate plane and a light output unit 32. Of the angles formed between the substrate plane and the slope 18 that is neither perpendicular nor parallel to the substrate plane, the acute angle is represented by $\Theta 1$. Here, the angle formed between the output direction (z-axis direction) from the light output unit 32 and the mirror surface of the mirror 33 is $45-\frac{1}{2}\theta_1$ (degrees) according to the Snell's law, and incident light can be made to enter perpendicularly with respect to the slope 18.

Figure 5:
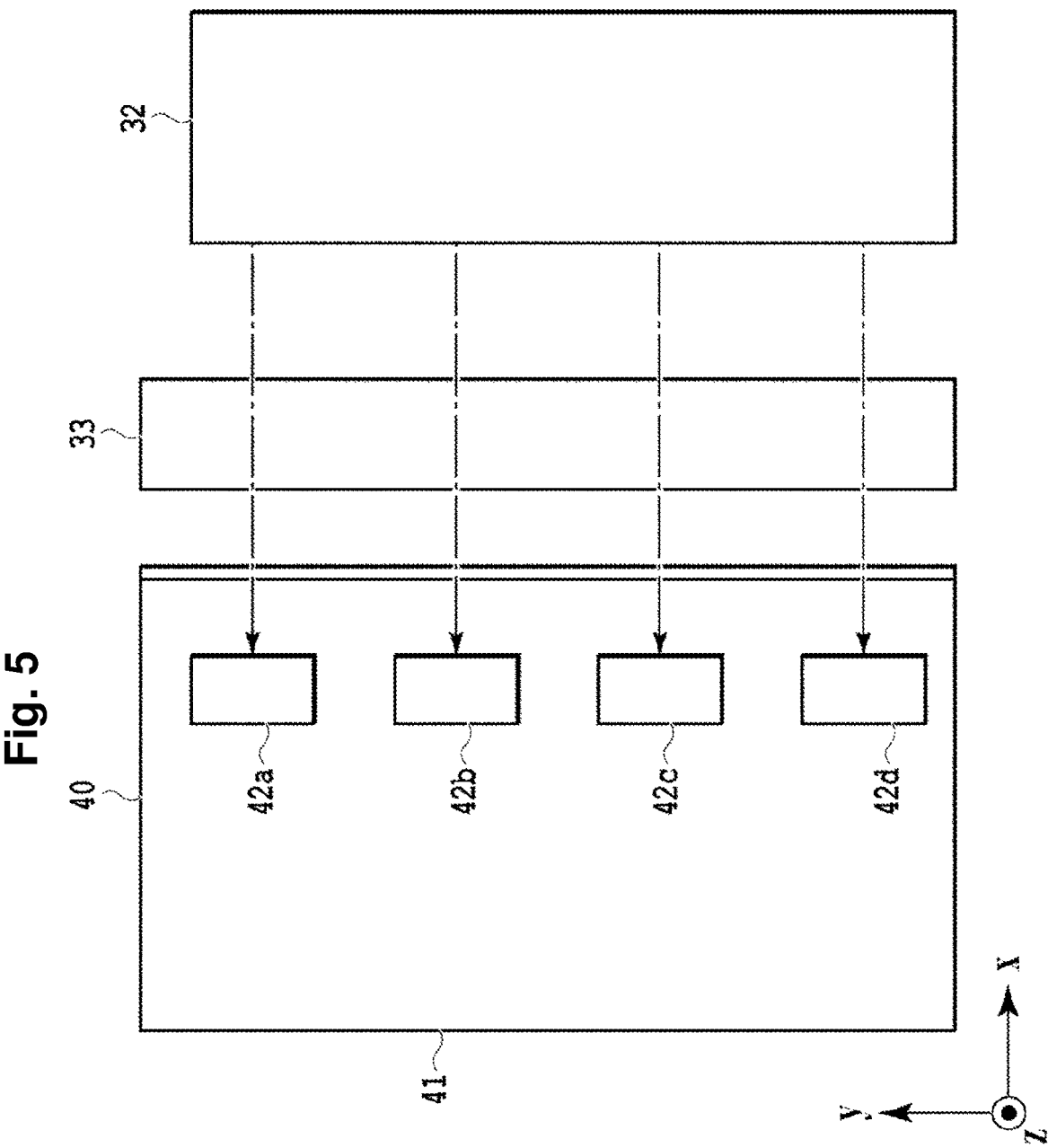
FIG. 5 is a diagram illustrating an example in which incident light of a plurality of channels is made to enter in the third example of a light output unit.

FIG. 5 illustrates an example in which incident light of a plurality of channels is made to enter in the third example of a light output unit. In a semiconductor light receiving element 40, a plurality of mesa-shaped light receiving units 42a to 42d, including a first semiconductor layer, a light absorbing layer, and a second semiconductor layer is formed on the front surface (the upper surface) of one substrate 41. In the substrate 41, a substrate plane (x-y plane) and a slope not perpendicular or parallel to the substrate plane, like the slope 18 illustrated in FIG. 4, are formed in the y-axis direction. The light receiving units 42 are arranged in the y-axis direction, and light is output from the light output unit 32 in parallel with the x-axis, and is made to enter the light receiving units 42 via the mirror 33.

Note that, even in a case where the output direction of the light output unit 30 is a direction (z-axis direction) perpendicular to the plane of the substrate 11 illustrated in FIG. 3, incident light of a plurality of channels can also be made to enter.

Figure 6:
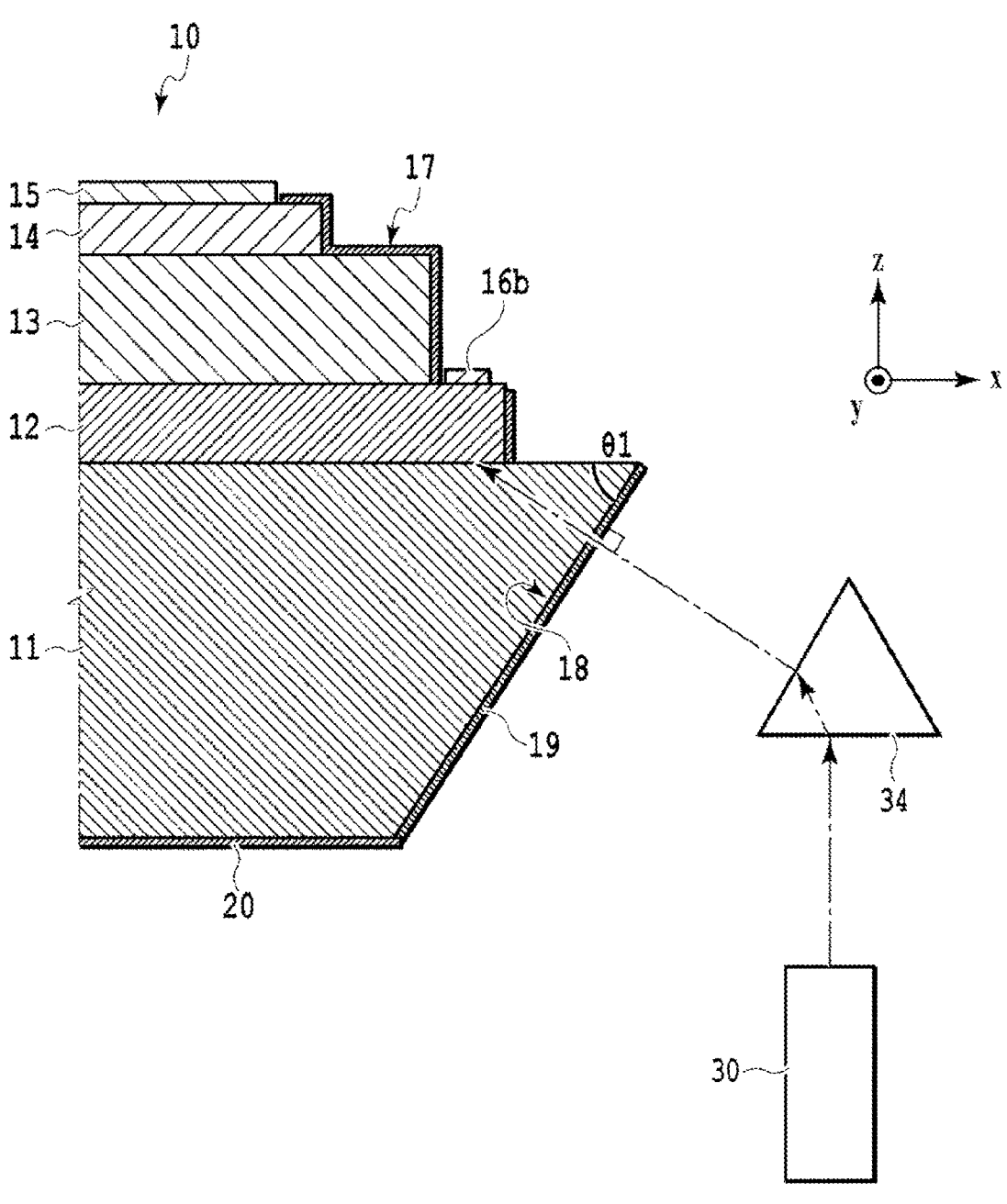
FIG. 6 is a diagram illustrating a fourth example of a light output unit that causes incident light to enter the light receiving element of the first embodiment.

FIG. 6 illustrates a fourth example of a light output unit that causes incident light to enter the light receiving element of the first embodiment. The output direction of the light output unit 30 is a direction (z-axis direction) perpendicular to the plane of the substrate 11 of the light receiving element 10. A prism 34 is provided as a light bending unit between the surface (the slope 18) that is neither perpendicular nor parallel to the substrate plane, and a light output unit 30. By adjusting the refractive index of the prism and the prism apex angle according to the Snell's law, incident light can be made to enter perpendicularly with respect to the slope 18. In a case where a prism is used, the size of the optical member may be larger than that with a mirror, but absorption on the metal surface that occurs when a mirror is used does not occur. Thus, a light receiver with a higher receiving sensitivity can be designed.

Second Embodiment

Figure 7:
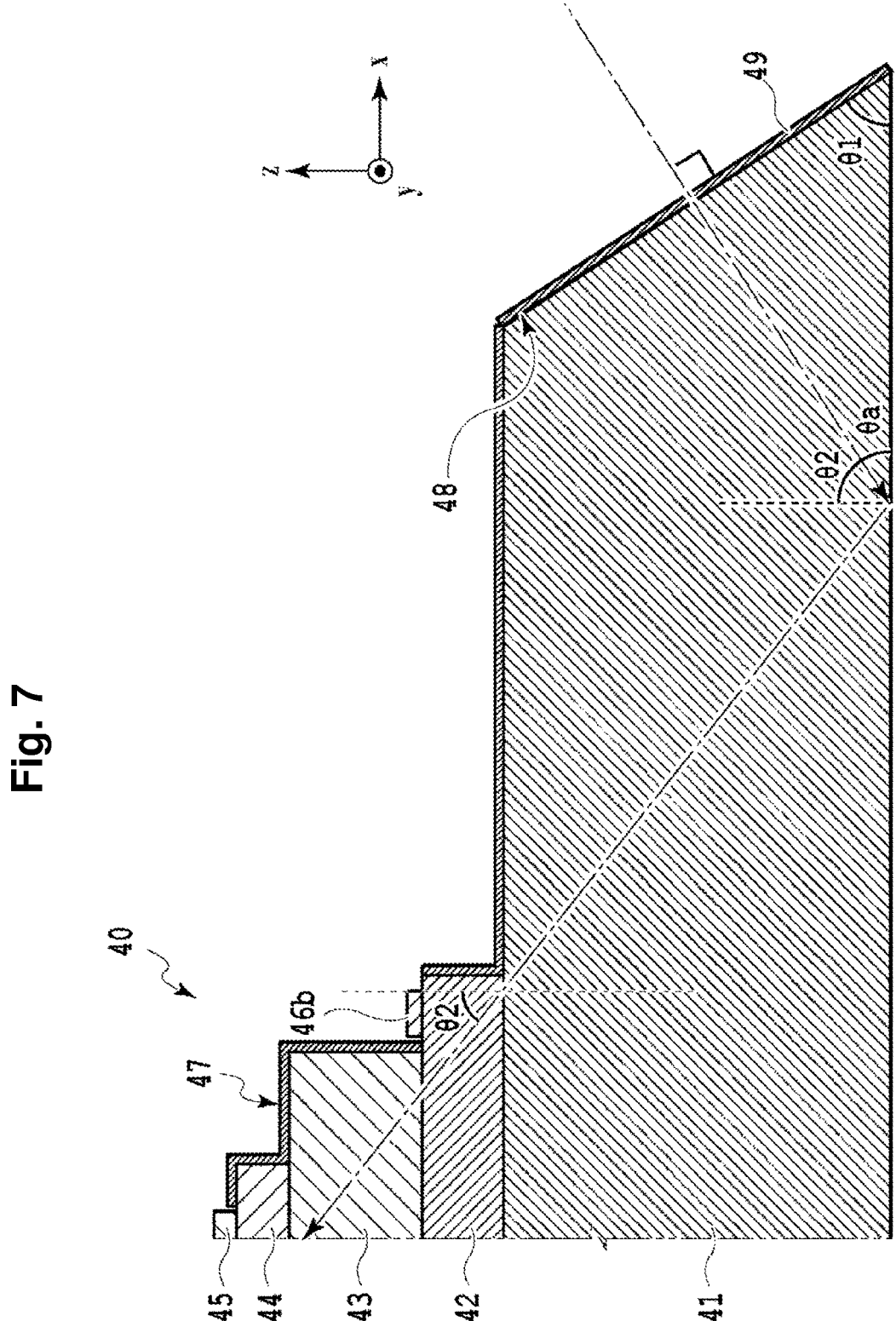
FIG. 7 is a diagram illustrating the structure of a light receiving element according to a second embodiment of the present invention.

FIG. 7 illustrates the structure of a light receiving element according to a second embodiment of the present invention. In a semiconductor light receiving element 40, a first semiconductor layer 42 that is formed on the front surface (the upper surface) of a substrate 41 and is formed with a semiconductor of a first conductivity type, a light absorbing layer 43 formed with a semiconductor, a second semiconductor layer 44 of a second conductivity type, and a first electrode 45 formed in contact with the second semiconductor layer 44 are stacked in this order. The first electrode 45 formed with a metal functions as a reflective film. Second electrodes 46a and 46b are formed on the upper surface of the first semiconductor layer 42, and the upper surface of the semiconductor light receiving element 40 excluding the electrodes is covered with a protective film 47 formed with SiN. In this manner, the mesa-shaped light receiving unit including the first semiconductor layer 42, the light absorbing layer 43, and the second semiconductor layer 44 is formed in a direction vertical to the upper surface of the substrate 41.

In the substrate 41, a slope 48 that is neither perpendicular nor parallel to the substrate plane (x-y plane) is formed, and an antireflective film 49 is formed thereon. As incident light enters perpendicularly to the slope 48 on which the antireflective film 49 that is not a birefringent material is formed, it is possible to form a light receiving element that has the lowest reflectance, a low loss, and a low polarization dependency.

In the second embodiment, incident light is incident perpendicularly with respect to the slope 48, is reflected by the bottom surface of the substrate 41, and then is incident the light absorbing layer 43 of the light receiving element 40 obliquely with respect to the z-axis, which is the semiconductor crystal growth direction, that is, the direction vertical to the upper surface of the substrate 41. The incident angle of incident light with respect to the z-axis is represented by θ2, and the acute angle of the angles formed between the substrate plane (x-y plane) and the slope 48 that is neither perpendicular nor parallel to the substrate plane is represented by θ1. In the cross-sectional view illustrated in FIG. 7, θ1 represents the angle formed between the back surface (the lower surface) of the substrate 41 and a surface that is neither perpendicular nor parallel to the substrate plane. In the second embodiment, the following equations are satisfied.

$$\theta 1 + \theta a = \theta 2 + \theta a = 90°$$

$$\theta 1 = \theta 2$$

Incident light that enters from the slope 48 that is neither perpendicular nor parallel to the substrate plane is reflected by the bottom surface of the substrate 41, and is directed to the light absorbing layer 43. Where the refractive index of the substrate 41 is represented by $n_2$, and the refractive index of the medium in contact with the back surface of the substrate 41 is represented by $n_b$, total reflection occurs when the following relationship is satisfied.

$$n_b \leq n_2 \sin \theta_2$$

In a case where total reflection does not occur, light propagates to the medium in contact with the back surface of the substrate 41, resulting in a loss. In a case where the above condition is not satisfied, a reflective film such as a mirror is formed on the back surface of the substrate 41 so as to cause total reflection.

The incident light reflected by the bottom surface of the substrate 41 passes through the light absorbing layer 43, is reflected and returned by the reflective film (the first electrode 45), and again passes through the light absorbing layer 43. The optical path length over which incident light passes through the light absorbing layer 43 is expressed as $$\text{(optical path length)} = 2x/\cos \theta_2,$$

where x represents the thickness of the light absorbing layer 43. In a case where incident light enters perpendicularly from the back surface of the substrate 41, the optical path length is twice (2×) the thickness of the light absorbing layer 43, and, in a case where $\theta_2$ is an acute angle ($0 < \cos \theta_2 < 1$), the optical path length in the light absorbing layer 43 is greater than 2×.

According to the second embodiment, as incident light enters from the slope 48, the optical path length in the light absorbing layer 43 can be made longer than that in a case where incident light enters perpendicularly with respect to the substrate plane (x-y plane). The slope 48 is a plane orthogonal to incident light, both polarized waves can enter perpendicularly with respect to the entrance plane, and the reflectance of both polarized waves is equal. Accordingly, it is possible to form a light receiving element that has a lower reflectance on the entrance plane and a lower polarization dependency, while having a greater optical path length.

In the second embodiment, incident light that has entered from the slope 48 has an optical path to be reflected and returned by the bottom surface of the substrate 41. Accordingly, the distance from the slope 48 to the light absorbing layer 43 is longer than that in the first embodiment.

Method for Manufacturing the Light Receiving Element

A means for achieving the semiconductor light receiving element 40 is now described. A mesa-shaped light receiving unit including an n-type contact layer (the first semiconductor layer 42), the light absorbing layer 43, and a p-type contact layer (the second semiconductor layer 44) is formed on the front surface of the substrate 41, as in the first embodiment. After that, the metal electrodes (45 and 46) are formed on the n-type contact layer and the p-type contact layer. A through hole is then formed, and a SiN film 47 is formed on the entire upper surface of the light receiving element 40. Next, the slope 48 is formed on the substrate 41, and the antireflective film 49 is formed on the slope 48.

In the first embodiment, to form the slope 18 that is neither perpendicular nor parallel to the substrate plane, a back surface process of forming the slope by performing etching from the back surface of the substrate 11 is necessary. In the second embodiment, it is possible to form the slope 48 on the substrate 41 simply by a top surface process.

Although a pin photodiode has been described as an example in the second embodiment, the embodiment can also be applied to an avalanche photodiode in which a multiplication layer is formed between the first semiconductor layer 42 and the second semiconductor layer 44.

As for the substrate material in the second embodiment, the material of the substrate should be a semi-insulating substrate without carrier doping, such as semi-insulating InP having a substrate resistance of 1 MΩcm or higher, for example, as in the first embodiment. With this arrangement, a light receiving element with a higher sensitivity can be manufactured.

(Light Output Unit)

A light output unit for causing incident light to enter the light receiving element 40 can be designed to cause light to directly enter perpendicularly with respect to the slope 48 of the light receiving element 40. It is also possible to adopt a light output unit that outputs light perpendicularly to the substrate plane via a light bending unit such as a mirror or a prism, to adopt a light output unit that outputs light in parallel to the substrate plane via a mirror, or to adopt a configuration in which incident light of a plurality of channels is made to enter, as in the first embodiment.

In the first embodiment, the light output unit 30 or 32 is disposed on the lower surface side of the substrate 11. In the second embodiment, however, the light output unit 30 or 32 can be disposed on the upper surface side of the substrate 41.

Third Embodiment

Figure 8:
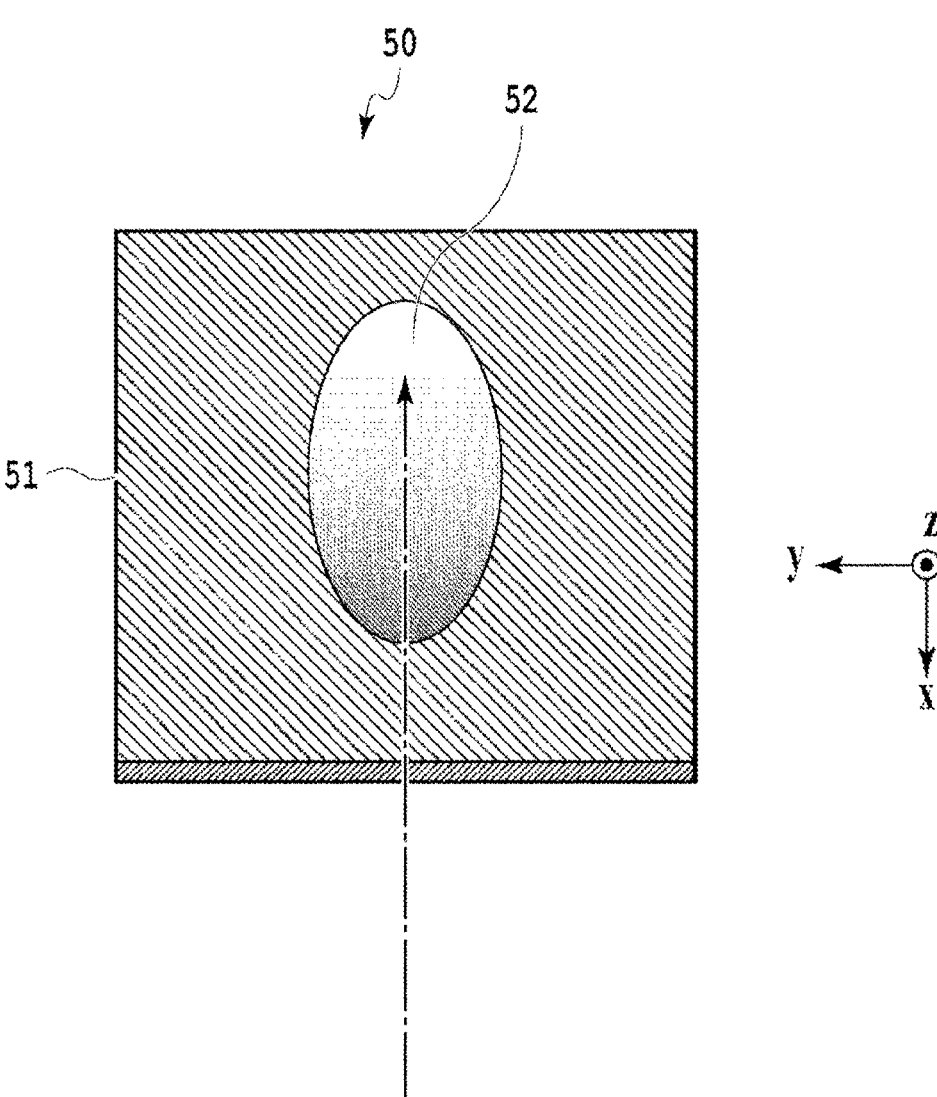
FIG. 8 is a diagram illustrating the structure of a light receiving element according to a second embodiment of the present invention.

FIG. 8 illustrates the structure of a light receiving element according to a second embodiment of the present invention. The structure of a semiconductor light receiving element 50 in the z-axis direction which is the semiconductor crystal growth direction is the same as that of the first embodiment. In the third embodiment, on the front surface (the upper surface) of a substrate 51 of a mesa-shaped light receiving unit 52, the length in the x-axis direction parallel to the optical axis of incident light is longer than the length in the orthogonal y-axis direction. Since incident light that enters from a slope formed on the substrate 51 has a desired beam diameter, the region through which the incident light that has entered in the x-axis direction is transmitted when reciprocating in the light absorbing layer can be made larger. Thus, light receiving sensitivity can be increased.

As long as the structure is long in the x-axis direction, the structure may be a rectangular structure that has the corners rounded to an extent that light entrance is not hindered, or an oval structure as illustrated in FIG. 8. The size of the light receiving element can be made smaller in the latter structure. Accordingly, in the latter structure, not only the light receiving sensitivity is not degraded, but also a high-speed response can be advantageously obtained. Note that the size in the y-axis direction only needs to be a size in which the beam diameter of incident light fits. According to the third embodiment, it is possible to achieve both optical path length extension and high-speed responses.

According to the first to third embodiments, incident light is made to enter perpendicularly to the entrance plane that is neither perpendicular nor parallel to the substrate plane, so that polarized light at various angles can be made to enter the light receiving element with uniform reflectance. Further, the incident light is made to enter obliquely with respect to the light absorbing layer of the light receiving element, so that the length of the optical path extending through the light absorbing layer can be extended. As the optical path length is extended, quantum efficiency becomes higher, and the light receiving characteristics of the light receiver can be improved.

The invention claimed is:

1. A light receiving element, comprising:
a first semiconductor layer that is formed on an upper surface of a substrate and is formed with a semiconductor of a first conductivity type;
a light absorbing layer formed with a semiconductor;
a second semiconductor layer formed with a semiconductor of a second conductivity type, a first electrode that is formed in contact with the second semiconductor layer, is formed with a metal, and functions as a reflective film; and
a second electrode formed on the first semiconductor layer are formed in a vertical direction on the upper surface of the substrate,
wherein a slope that is neither perpendicular nor parallel to a substrate plane is formed on the substrate;
incident light that has perpendicularly entered the slope is made to enter the light absorbing layer obliquely with respect to the vertical direction; and
the incident light is made to enter from a light output unit disposed on a lower surface side of the substrate by a light bending unit disposed between the slope and the light output unit that inputs the incident light.

2. A light receiving element, comprising:
a first semiconductor layer that is formed on an upper surface of a substrate and is formed with a semiconductor of a first conductivity type;
a light absorbing layer formed with a semiconductor;
a second semiconductor layer formed with a semiconductor of a second conductivity type, a first electrode that is formed in contact with the second semiconductor layer, is formed with a metal, and functions as a reflective film; and
a second electrode formed on the first semiconductor layer are formed in a vertical direction on the upper surface of the substrate,
wherein a slope that is neither perpendicular nor parallel to a substrate plane is formed on the substrate; and
incident light that has perpendicularly entered the slope is reflected by a bottom surface of the substrate, and is made to enter the light absorbing layer obliquely with respect to the vertical direction.

3. The light receiving element according to claim 2, wherein the incident light is made to enter from a light output unit disposed on an upper surface side of the substrate by a light bending unit disposed between the slope and the light output unit that inputs the incident light.

4. The light receiving element according to claim 1, wherein the light bending unit is a mirror.

5. The light receiving element according to claim 1, wherein the light bending unit is a prism.

6. The light receiving element according to claim 1, wherein an antireflective film is formed on the slope.

7. The light receiving element according to claim 1, wherein, in the light absorbing layer, a length in a direction parallel to an optical axis of the incident light is longer than a length in a direction orthogonal to the optical axis.

8. The light receiving element according to claim 3, wherein the light bending unit is a mirror.

9. The light receiving element according to claim 3, wherein the light bending unit is a prism.

10. The light receiving element according to claim 2, wherein an antireflective film is formed on the slope.

11. The light receiving element according to claim 2, wherein, in the light absorbing layer, a length in a direction parallel to an optical axis of the incident light is longer than a length in a direction orthogonal to the optical axis.

* * * * *